United States Patent [19]

Guch, Jr.

[11] Patent Number: 4,601,038
[45] Date of Patent: Jul. 15, 1986

[54] CONDUCTION COOLED SOLID STATE LASER

[75] Inventor: Steve Guch, Jr., Saratoga, Calif.

[73] Assignee: GTE Government Systems Corporation, Stamford, Conn.

[21] Appl. No.: 695,764

[22] Filed: Jan. 28, 1985

Related U.S. Application Data

[63] Continuation of Ser. No. 555,750, Nov. 28, 1983, abandoned, which is a continuation of Ser. No. 319,838, Nov. 9, 1981, Pat. No. 4,429,348.

[51] Int. Cl.$^4$ .............................................. H01S 3/04
[52] U.S. Cl. .................................... 372/34; 372/35; 372/72
[58] Field of Search ..................... 372/34, 35, 36, 72

[56] References Cited
U.S. PATENT DOCUMENTS 3,487,332 12/1969 Cordy, Jr. ........................... 372/36
4,096,450 6/1978 Hill et al. ............................ 372/35

Primary Examiner—James W. Davie
Attorney, Agent, or Firm—John F. Lawler; Douglas M. Gilbert

[57] ABSTRACT

The exterior surfaces of a laser rod and pump lamp are covered with a highly reflective metal foil to prevent light leakage from the rod and lamp. The laser rod and pump lamp operate within a cavity inside a heat sink. Between the metal foil and the housing is a thermally conductive fluidic material selected to provide a tailored thermal impedance between the heat sink and the rod and pump to optimize the steady state temperatures of these components. The conductive fluid is not circulated but is contained to act as a simple heat conductor. The optically reflective and the heat transfer functions of the laser pumping operation are essentially separate from each other, enabling selection of materials for these respective functions to enhance performance of the laser and substantially simplify its construction.

19 Claims, 6 Drawing Figures

CONDUCTION COOLED SOLID STATE LASER

RELATED APPLICATION

This is a continuation of Ser. No. 555,750, filed Nov. 28, 1983, now abandoned, which is a continuation of Ser. No. 319,838, filed Nov. 9, 1981, now Pat. No. 4,429,398, issued Jan. 31, 1984.

BACKGROUND OF THE INVENTION

This invention relates to lasers and more particularly to conductively cooled optically pumped solid state lasers.

Laser rods and pump lamps of solid state lasers typically are cooled by liquids or gases flowing over their outer surfaces. Such laser assemblies are inherently complex, expensive and often have design limitations for a number of reasons. For example, the coolant often decomposes under the intense ultraviolet radiation generated by the flashlamp itself, and this limits the life of the laser unless the coolant is changed frequently to maintain strict purity requirements. Also the mechanical circulating system components must be regularly maintained to prevent a system failure. In addition, circulating fluid cooling systems usually require seals which complicate and increase the cost of construction, installation and maintenance of the laser assembly.

Other designs of solid state lasers have used conduction cooling by connecting laser rods and lamps directly to the heat sink. This design is often used where the laser is meant to operate at temperatures that are above ambient room temperatures. To establish thermal contact between the heat source (rod or lamp) and the heat sink, the two are permanently affixed by brazing, bonding or soldering with compounds that generally exhibit limited light reflectivity. Such technique is described, for example, in U.S. Pat. No. 4,170,763. The problem with brazing, bonding or soldering the heat sources to the sink is that over time the brazing, bonding or soldering compounds may fail to maintain complete adhesion over the surfaces being joined, producing gaps between the heating elements and the heat sink. Such gaps reduce the thermal conductivity where ever they occur. The bonding or soldering materials fail over time, as do the coolants, either due to the intense radiation from the laser or because of the temperature cycling and the accompaning expansion/contraction of the materials. Unless the thermal coefficients of expansion are closely matched, the thermal stresses will eventually cause material fatigue and the unwanted gaps. Another major disadvantage of brazing, bonding, or soldering is that, unless thermal expansion coefficients of the adhesing material and both surfaces being joined are closely matched, large stresses may be developed in the laser rod. These stresses are often sufficient to produce either significant birefringence lasses or to strain the laser rod to the material fracture limit.

Another technique for establishing such thermal contact is pressing the heat source into, or otherwise surrounding it with a thermally-conductive medium such as a dry dielectric powder which provides heat transfer to a large heat sink. The problem with the foregoing conductively cooled systems is that the individual components are not easily optimized. Materials having acceptable thermal and reflective properties cannot readily be optimized for both. Furthermore such materials cannot readily be brought into intimate contact with the heat/light sources over large cylindrical surface areas as required for efficient pumping and heat removal. In addition, the thermal expansion of the rod or pump will cause the powder to eventually compact. This produces, as was the problem with solders, gaps between the rod or pump and the conductive powder. However, in this case both the thermal conductivity and the reflectivity of the assembly degrades.

This invention is directed to a laser construction which overcomes these difficulties.

OBJECTS AND SUMMARY OF THE INVENTION

A general object of the invention is the provision of a solid state laser that is higly efficient in both optical pumping and in heat removal.

A further object is the provision of a conductively cooled optically pumped laser in which thermal impedance between the heat sources and the heat sink is selectively variable without affecting the efficiency of optical coupling between the lamp and laser rod.

A further object is the provision of such a laser assembly that is simple in construction, easy to install and maintain, and that will not lose its cooling properties with age.

A further object is the provision of a conductively cooled optically pumped laser in which the cooling medium is isolated from the damaging light radiation of the pump and laser rod.

These and other objects of the invention are achieved with a conductively cooled optically pumped laser in which remotely opposed external surface portions of the cylindrically shaped laser rod and pump lamp are each covered by a thin highly reflective and highly thermally conductive layer or sheet backed by a thermally conductive fluidic material having a selected thermal conductivity and disposed in intimate contact with the layer and heat sink. The conductive layer preferably is a malleable metal foil in intimate contact with the surface of the heat source (rod or lamp). The conducting substance preferably is a fluid, contained within a sealed volume, providing an efficient heat path between the foil and heat sink. Given this type of construction, the reflection and thermal conduction requirements of this laser are substantially separate from each other, permitting optimization of each parameter for maximum efficiency in laser operation.

DESCRIPTION OF PREFERRED EMBODIMENTS

Figure 1:
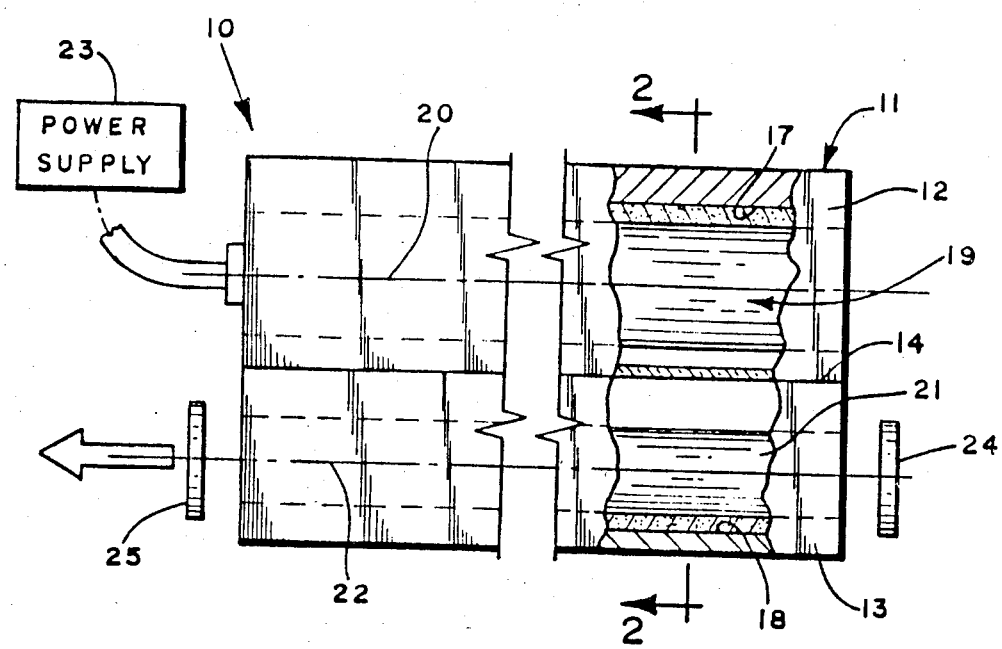
FIG. 1 is a schematic elevation partly in section of a laser embodying this invention.
Figure 2:
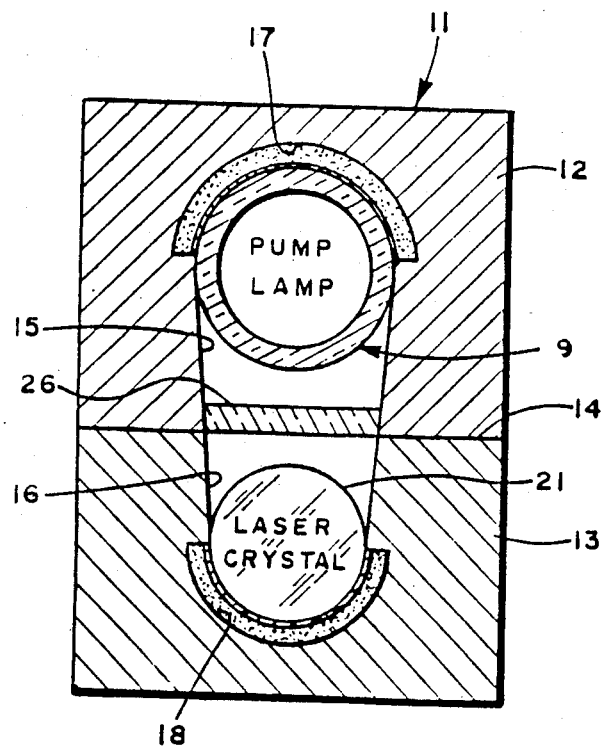
FIG. 2 is an enlarged transverse section taken on line 2—2 of FIG. 1.
Figure 3:
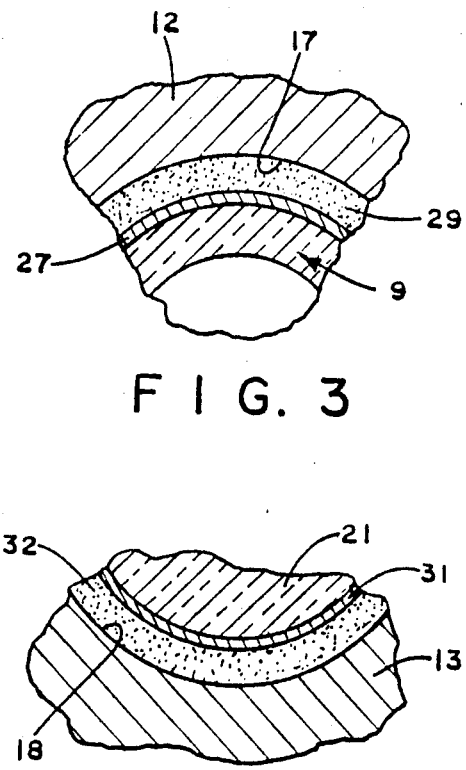
FIGS. 3 and 4 are greatly enlarged portions of FIG. 2 showing details of construction.

Referring now to the drawings, a laser 10 embodying this invention is shown in FIGS. 1 and 2. An elongated split housing 11 consists of first and second sections 12 and 13 which are joined together along plane 14. Sections 12 and 13 have elongated recesses 15 and 16, respectively, which together form the laser and pump cavity. The cavity has semicylindrical enlarged portions 17 and 18, respectively, on opposite sides of the cavity. Adjacent to and coaxial with enlarged portion 17 is a cylindrical pump lamp 19 having an axis 20 and a glass envelope 9. Typically the envelope thickness is around 1 mm. Similarly disposed in recess 16 is a cylindrical rod 21 comprising the laser crystal having an axis 22. Coextensive with and parallel to rod 21 is the enlarged portion 18. A power supply 23 connected to lamp 19 energizes it for optically pumping laser rod 21.

A totally reflective mirror 24 and a partially transmissive mirror 25 are spaced from opposite ends, respectively, of laser rod 21 along axis 22 and form the optical cavity of the laser. The coherent light output of the laser is as indicated by the arrow in FIG. 1. An optical filter 26 is disposed in recess 15 between and coextensive with lamp 19 and rod 21. Its function is to reduce or eliminate unwanted radiation components from lamp 19 to laser rod 21. Housing 11 acts as a heat sink to dissipate the heat conducted to it from the laser cavity.

Figure 5:
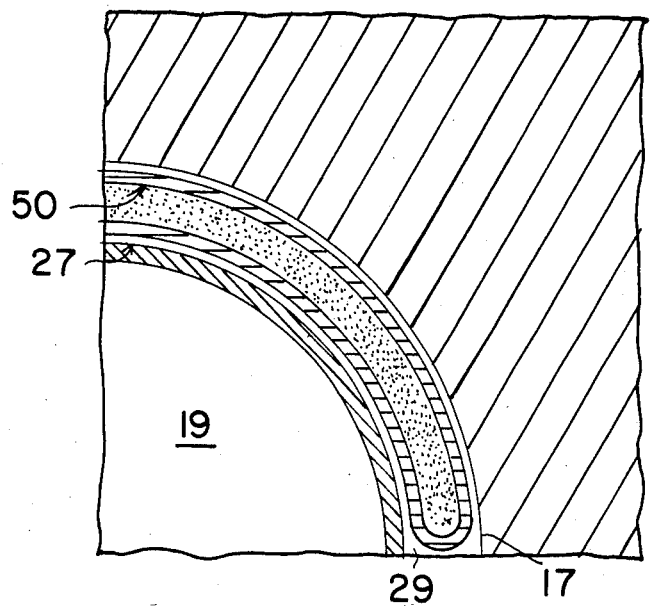
FIGS. 5 and 6 are enlarged portions of FIGS. 3 and 4, respectively, showing additional details of the heat transfer mechanism.

In accordance with this invention, a thin, highly reflective, highly thermally conductive sheet or layer 27, such as a foil of aluminum, gold or the like or a metallic coating, such as a silver coating, is brought into intimate contact with or deposited on the upper (as viewed) half external surface of lamp 19 remote from rod 21. (Hereinafter all reference to foil or foil-backed materials is meant to also include a coated structure unless a distinction between the two is otherwise indicated.) Enlarged portion 17 of recess 15 is adjacent to the foil-backed portion of lamp 19 and defines therewith an arcuate semicylindrical space which is filled with a fluidic heat transfer material 29 selected to have a desired thermal conductivity. If high thermal conductivity is desired, for example, liquid mercury or water may be used. If a higher thermal impedance is appropriate a poorly conducting fluid, such as low viscosity oils or gases may be used. The heat transfer material 29 preferably is contained as shown in FIG. 5 within a bladder 50. The bladder 50 may be made of rubber, a polymer synthetic, or some other type of thin resilient material having enough strength and elasticity to contain the fluid but also having sufficient heat transfer capabilities so as not to appreciably affect the heat conductance to the housing 11. The object is to make the thermal impedance between these parts substantially that of fluidic material 29. If a bladder 50 is used, care must be taken upon installation to minimize or eliminate air trapped between the foil 27(31) or the sink 12(13) and the bladder 50. For the same reason foil 27(31) preferably is tightly pressed against the outer surface of lamp 19 (rod 21), i.e. to minimize or eliminate entrapment of air between lamp surface and foil and thus minimize thermal impedance between these parts. Of course the use of a reflective coating instead of a foil would eliminate this consideration.

Figure 4:
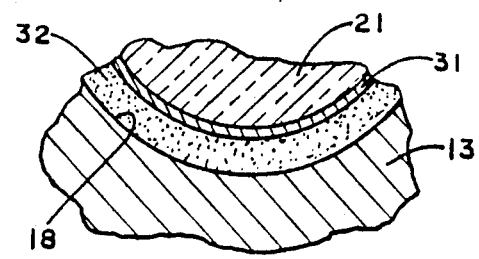
Figure 6:
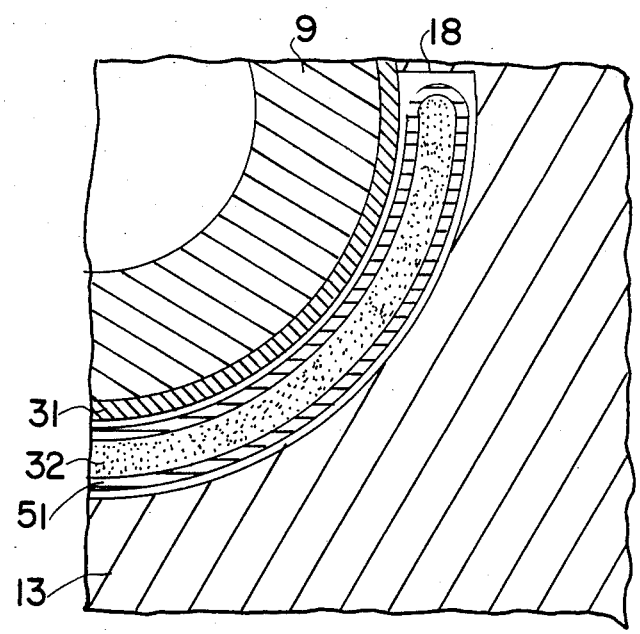

As viewed in FIGS. 4 and 6, laser rod 21 is similarly covered over its lower half portion by a foil 31. Similarly, contained within a bladder 51 in enlarged portion 18 of recess 16 is a material 32 pre-selected to have the desired thermal conductivity. Alternatively, if a foil is used as opposed to a reflective coating, the foil may be wrapped around the entire lamp and laser rod assembly prior to insertion into the cavity of the heat sink. This is mainly a consideration of assembly rather than of any improvement in performance; however, it would necessitate trapping filter 26 between lamp 19 and rod 21 before inserting into the heat sink cavity.

Most of the light generated by lamp 19 is directly absorbed in the laser crystal 21. The light generated by lamp 19 which is incident on foil 27 is substantially reflected by the foil. The reflected energy is either directly absorbed by the laser crystal 21 or is re-reflected by foil 31 back into laser crystal 21 since the reflection coefficient of such foil is very high. Aluminum foil, for example, has a reflection coefficient in excess of 90% although a silver coating would be much higher. The heat generated by lamp 19 and crystal 21 is conducted directly through the foil to the fluidic material 29 and 32, respectively, since the thermal conductivity of such foil is extremely high, i.e. 2.38 watts/cm/°K. And the expansion/contraction problem mentioned above is overcome with a foil since the foil could either expand or slide over the glass envelope. Similarly a thin coating, of for example silver, would expand and contract with the glass envelope.

Although foils have been used in the past as reflectors in laser assemblies, they have not been used as part of a heat transfer mechanism as contemplated by this invention. Not only does the use of a foil increase the efficiency of the pump lamp, but it also advantageously blocks unwanted light radiation from causing an undesirable deterioration of the materials surrounding the lamp and laser rod. For this reason a bladder material may be used that would otherwise be unacceptable were it to come in contact with such radiation. In addition the coolant (heat transfer) material 29 and 32 may be used with or without a bladder 50 since it would be again shielded from the radiation. If a bladder 50 is not used, then some other form of containment should be used such as O-ring gaskets sealing the enlarged portions 17 and 18. Here again since the gaskets are shielded from the light radiation, they can be used without the concern that they would breakdown and have to be replaced. However, the use of a bladder has a slight advantage over an otherwise contained fluid, in that any expansions or contractions caused by the temperature variations expected can be accomodated since the bladder itself is flexible. In this regard an expansion chamber or other form of relief must be provided such as a duct to the open recesses 15 or 16. On the other hand the bladder 50 and 51 could be eliminated in preference to a sealed gasket system as mentioned, and some other mechanism provided to permit for some degree of expansion of the fluid.

By careful selection of the fluidic materials 29 and 32, and the dimensions of the various recesses one can tailor the heat transfer to virtually any rod/lamp requirements. For example as a rough approximation, the equation for heat transfer through a flat slab may be used:

$$Q = \frac{(K)(A)(\Delta T)}{t}$$

where Q is the rate of heat transfer, K is the coefficient of thermal conductivity, A is the surface area through which the heat flows, $\Delta T$ is the temperature differential between the heat sink and source, and t is the thickness of the heat transfer material. In most cases, highly thermally conductive substances 29 and 32 are preferred for maximum transmission of heat from the heat sink. In the event it is desired to operate the laser at relatively elevated temperatures, however, as in the case of vibronic lasers described in my copending application Ser. No. 258,110, materials 29 and 32 having a lower thermal conductivity coefficient is used and thus provides higher impedance to accomplish this result.

A laser assembly embodying the invention and having the following physical characteristics was constructed and successfully operated:

| Laser rod 21 | |
|---|---|
| Crystal | Alexandrite |
| Diameter | 2.3 mm |
| Length | 40 mm |
| Shape | cylindrical |
| Lamp 19 | |
| Type | Xenon flashlamp |
| Outside diameter | 5 mm |
| Pressure | 400 Torr |
| Arc length | 37.5 mm |
| Shape | cylindrical |
| Layer 27/31 | aluminum foil |
| Material 29/32 | air at 1 atms pressure |
| Rod operating temperature | 34° C. to 310° C. |

While the invention has been described with reference to its preferred embodiments, it should be understood by those skilled in the art that various changes may be made and equivalents may be substituted for elements thereof without departing from the spirit and scope of the invention. In addition, many modifications may be made to adapt a particular material to the teaching of the invention without departing from its essential teachings. For example, there is no reason that the heat transfer material in recesses 18 and 17 be the same. By selecting heat transfer materials with different thermal conductivities, one can more easily control the steady state temperatures of the lamp and crystal components.

What is claimed is:

1. A conductively cooled laser assembly comprising:
   an elongated housing constituting a heat sink having a cavity and comprising first and second sections;
   a laser crystal in said cavity within said first section;
   a pump lamp in said cavity within said second section;
   a totally reflective element and a partially transmissive element adjacent to opposite ends, respectively, of said crystal and defining therebetween the laser cavity;
   a first thin highly reflective and highly thermally conductive layer engaging the exterior of said crystal adjacent to said housing;
   a second thin highly reflective and highly thermally conductive layer engaging the exterior of said lamp adjacent to said housing;
   a first space between said first conductive layer and said housing;
   a second space between said second conductive layer and said housing;
   a first separate fluidic material having a predetermined thermal conductivity and confined within said first space in engagement with said first conductive layer and said housing for transmitting heat from said crystal to said housing; and
   a second separate fluidic material having a predetermined thermal conductivity and confined within said second space in engagement with said second conductive layer and said housing for transmitting heat from said lamp to said housing.

2. The assembly according to claim 1 in which said conductive layers comprise metallic foil.

3. The assembly according to claim 2 in which said conductive layers comprise aluminum foil.

4. The assembly according to claim 1 in which said conductive layers are metallic coatings.

5. The assembly according to claim 1 in which said crystal and said lamp are cylindrical, said layers being semicylindrical and on opposite sides, respectively, of said crystal and said lamp.

6. The assembly according to claim 1 wherein said fluidic material is a gas.

7. The assembly according to claim 6 wherein said gas is air.

8. The assembly according to claim 1 wherein said fluidic material is a liquid.

9. The assembly according to claim 1 further comprising:
   a first bladder means made of an elastic material having a high thermal conductivity and further confining said first fluidic material within said first space; and
   a second bladder means made of an elastic material having a high thermal conductivity and further confining said second fluidic material within said second space.

10. The assembly according to claim 9 wherein said fluidic material is a liquid.

11. The assembly according to claim 10 wherein said fluidic material is water.

12. The assembly according to claim 10 wherein said fluidic material is liquid mercury.

13. The assembly according to claim 11 wherein said conductive layers comprise aluminum foil.

14. A conductively cooled laser assembly comprising:
   a housing constituting a heat sink having an elongated pump cavity and comprising first and second sections;
   a pump lamp in said cavity within said first section;
   a laser crystal in said cavity within said second section;
   a totally reflective element and a partially transmissive element adjacent to opposite ends, respectively, of said crystal and defining therebetween the laser cavity;
   thin optically reflective thermally conductive layers engaging the exterior surfaces, respectively, of said lamp and said crystal adjacent to said housing; and
   thermally conductive fluidic material separate from said layer and said housing between and in engagement with each of said layers and said housing whereby heat from said lamp and said crystal is transmitted through said layers and said material to said housing.

15. The assembly according to claim 14 wherein said fluidic material is a gas.

16. The assembly according to claim 15 wherein said gas is air.

17. The assembly according to claim 14 wherein said fluidic material is a liquid.

18. The assembly according to claim 14 in which said layers comprise metallic foil.

19. The assembly according to claim 16 further comprising a bladder means made of an elastic material having a high thermal conductivity and further confining said fluid between said housing and said conductive layer.

* * * * *